(12) United States Patent
Fukumizu (10) Patent No.: US 8,258,494 B2
(45) Date of Patent: Sep. 4, 2012

(54) NONVOLATILE MEMORY DEVICE AND METHOD FOR MANUFACTURING SAME

(75) Inventor: Hiroyuki Fukumizu, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 289 days.

(21) Appl. No.: 12/726,720

(22) Filed: Mar. 18, 2010

(65) Prior Publication Data

US 2010/0244248 A1    Sep. 30, 2010

(30) Foreign Application Priority Data

Mar. 25, 2009  (JP) .................................. 2009-75252

(51) Int. Cl.
  *H01L 47/00*  (2006.01)
  *H01L 29/06*  (2006.01)
(52) U.S. Cl. ............................................... 257/4; 257/5
(58) Field of Classification Search .................. 257/2–5, 257/390, E31.001, E31.027
See application file for complete search history.

(56) References Cited

U.S. PATENT DOCUMENTS

| 7,906,392 B2 * | 3/2011 | Dunton et al. | 438/239 |
| 7,935,952 B2 * | 5/2011 | Lee et al. | 257/4 |
| 8,022,381 B2 * | 9/2011 | Toda | 257/2 |

FOREIGN PATENT DOCUMENTS

| JP | 2005-522045 | 7/2005 |
| JP | 2007-184419 | 7/2007 |
| JP | 2008-235637 | 10/2008 |
| WO | WO 03/085675 A2 | 10/2003 |

* cited by examiner

*Primary Examiner* — Hung Vu
(74) *Attorney, Agent, or Firm* — Oblon, Spivak, McClelland, Maier & Neustadt, L.L.P.

(57) ABSTRACT

A nonvolatile memory device, includes: a lower side electrode aligned in a first direction; an upper side electrode positioned above the lower side electrode and aligned in a second direction intersecting the first direction; and a memory unit provided between the lower side electrode and the upper side electrode. At least one selected from the lower side electrode and the upper side electrode includes a first electrode and a second electrode, the first electrode having a forward-tapered side wall, the second electrode having a reverse-tapered side wall and being adjacent to the first electrode via an insulating layer in substantially identical plane.

8 Claims, 7 Drawing Sheets

NONVOLATILE MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2009-075252, filed on Mar. 25, 2009; the entire contents of which are incorporated herein by reference.

BACKGROUND

1. Field

Embodiments of the invention relate generally to a nonvolatile memory device and a method for manufacturing the same.

2. Background Art

It is considered that bit density improvements have limitations for NAND type flash memory often used as nonvolatile memory devices. A cross-point nonvolatile memory device having a configuration in which, for example, a memory unit having a changeable electrical resistance is interposed between two electrodes has received attention as a nonvolatile memory device capable of having a so-called $4F^2$ element surface area, that is, a bit density higher than that of flash memory (JP-A 2007-184419 (Kokai)).

In other words, the element surface area of one memory cell of a cross-point nonvolatile memory device generally is $4F^2$ because the width of the interconnect is F and the spacing between the interconnects is F, where F is the minimum pattern line width of the lithography.

Further improvements of the bit density of cross-point nonvolatile memory devices are expected.

In the case where the bit density is increased, the interconnects become finer; the adhesion between the interconnects and the substrate weakens; and the reliability unfortunately decreases.

SUMMARY

According to an aspect of the invention, there is provided a nonvolatile memory device, including: a lower side electrode aligned in a first direction; an upper side electrode positioned above the lower side electrode and aligned in a second direction intersecting the first direction; and a memory unit provided between the lower side electrode and the upper side electrode, at least one selected from the lower side electrode and the upper side electrode including a first electrode and a second electrode, the first electrode having a forward-tapered side wall, the second electrode having a reverse-tapered side wall and being adjacent to the first electrode via an insulating layer in substantially identical plane.

According to another aspect of the invention, there is provided a method for manufacturing a nonvolatile memory device, the device including a lower side electrode aligned in a first direction, an upper side electrode positioned above the lower side electrode and aligned in a second direction intersecting the first direction, and a memory unit provided between the lower side electrode and the upper side electrode, the method including: manufacturing at least one selected from the lower side electrode and the upper side electrode, the manufacturing at least the one selected from the lower side electrode and the upper side electrode including: forming a plurality of first electrodes having band configurations disposed in parallel; forming each of a plurality of insulating layers on each of side faces of the plurality of first electrodes; and filling a conductor between the insulating layers adjacent to each other to form a second electrode.

According to another aspect of the invention, there is provided a method for manufacturing a nonvolatile memory device, the device including a lower side electrode aligned in a first direction, an upper side electrode positioned above the lower side electrode and aligned in a second direction intersecting the first direction, and a memory unit provided between the lower side electrode and the upper side electrode, the method including: manufacturing at least the one selected from the lower side electrode and the upper side electrode, the manufacturing at least the one selected from the lower side electrode and the upper side electrode including: forming a plurality of sacrificial layers having band configurations disposed in parallel; forming each of a plurality of insulating layers on each of side faces of the plurality of sacrificial layers; removing the plurality of sacrificial layers; and filling a conductor between the insulating layers adjacent to each other.

DETAILED DESCRIPTION

Exemplary embodiments of the invention will now be described in detail with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

First Embodiment

Figure 1A:
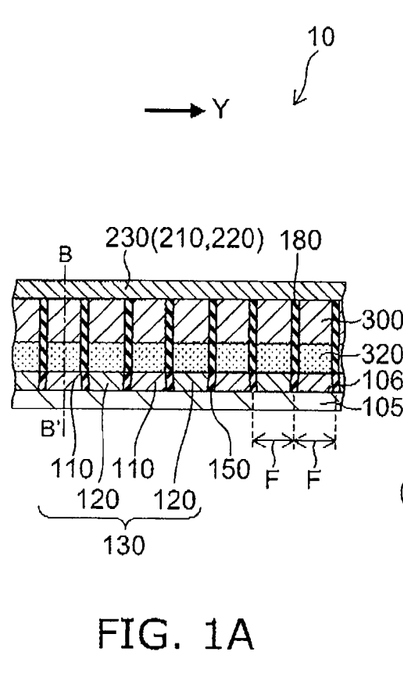
FIGS. 1A and 1B are schematic cross-sectional views illustrating the configuration of a nonvolatile memory device according to a first embodiment of the invention.
Figure 1B:
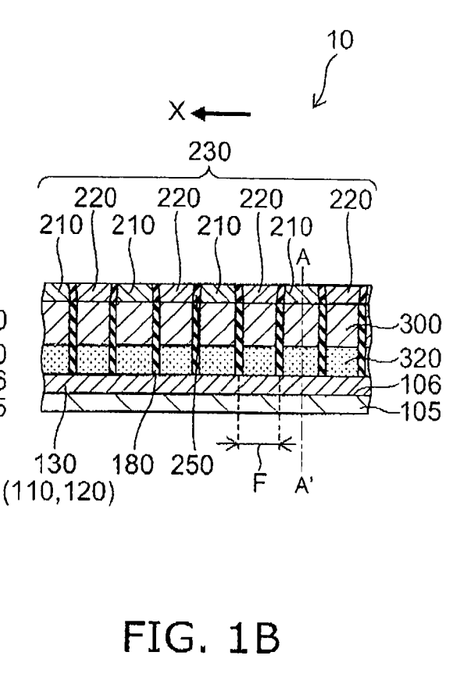

FIGS. 1A and 1B are schematic cross-sectional views illustrating the configuration of a nonvolatile memory device according to a first embodiment of the invention.

Figure 2A:
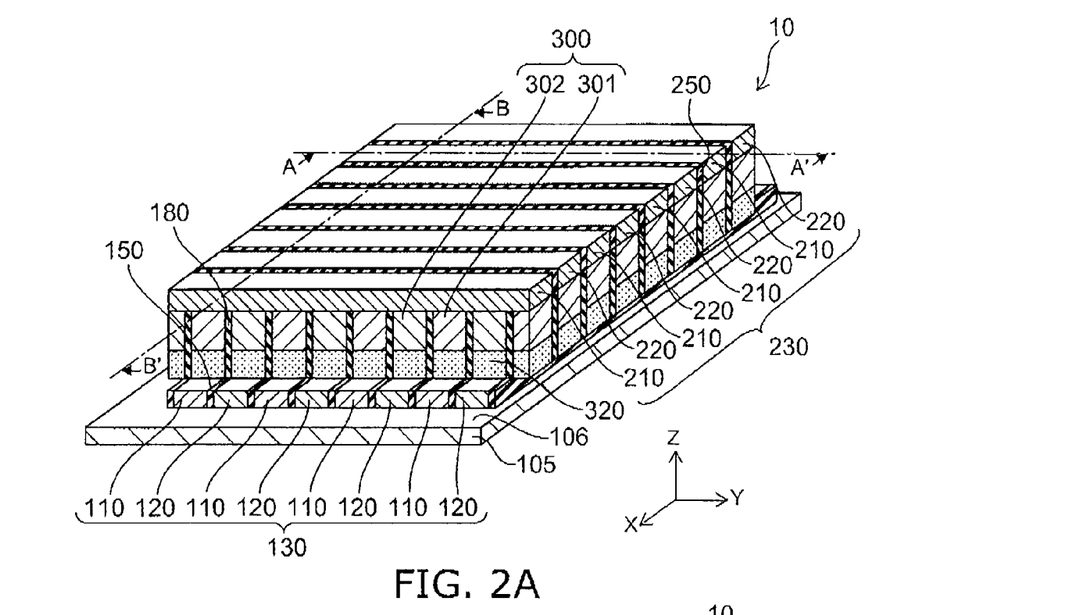
FIGS. 2A and 2B are schematic views illustrating the configuration of the nonvolatile memory device according to the first embodiment of the invention.
Figure 2B:
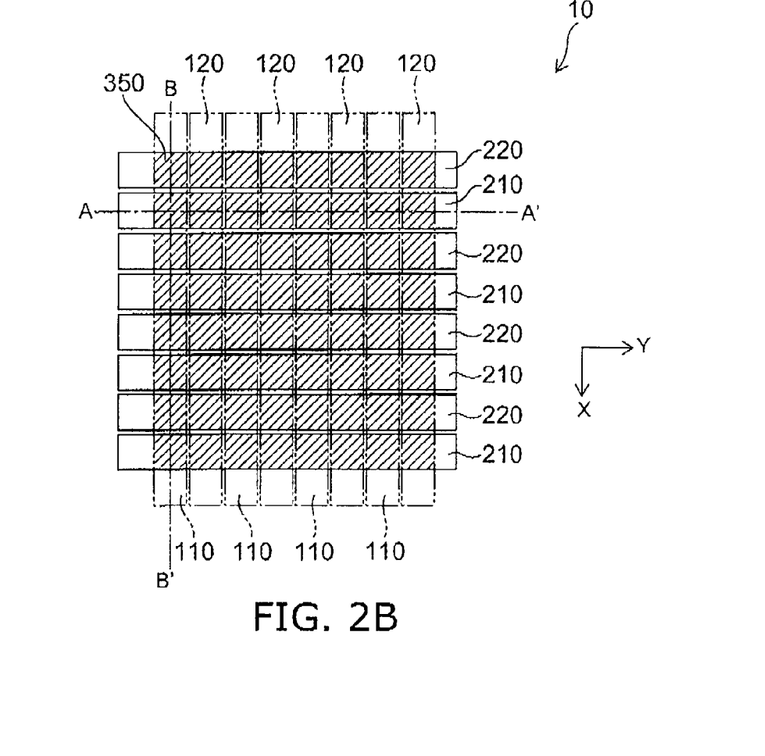

FIGS. 2A and 2B are schematic views illustrating the configuration of the nonvolatile memory device according to the first embodiment of the invention.

FIGS. 2A and 2B are a schematic perspective view and a schematic see-through plan view, respectively, illustrating the configuration of the nonvolatile memory device according to the first embodiment of the invention. FIG. 1A is a cross-sectional view along line A-A' of FIGS. 2A and 2B. FIG. 1B is a cross-sectional view along line B-B' of FIGS. 2A and 2B.

As illustrated in FIGS. 1A to 2B, a nonvolatile memory device 10 according to the first embodiment of the invention includes a lower side electrode 130 provided on a major surface 106 of a substrate 105, and an upper side electrode 230 positioned above the lower side electrode 130 and provided to oppose the lower side electrode 130, and a memory unit 300 provided between the lower side electrode 130 and the upper side electrode 230.

In this specific example, the alignment direction of the lower side electrode 130 and the alignment direction of the upper side electrode 230 are substantially orthogonal to each other. However, the invention is not limited thereto. In other words, it is not always necessary that the electrodes are orthogonal to each other. It is sufficient that the electrodes have a three dimensionally intersecting (non-parallel) relationship.

Here, the alignment direction of the lower side electrode 130 is taken as an X axis direction; and the alignment direction of the upper side electrode 230 is taken as a Y axis direction. An axis orthogonal to the X axis and the Y axis is taken as a Z axis.

The lower side electrode 130 includes a first lower side electrode 110 (the first electrode) and a second lower side electrode 120 (the second electrode). An insulating spacer layer 150 (the insulating layer) is provided between the first lower side electrode 110 and the second lower side electrode 120.

On the other hand, the upper side electrode 230 includes a first upper side electrode 210 (the first electrode) and a second upper side electrode 220 (the second electrode). An insulating spacer layer 250 (the insulating layer) is provided between the first upper side electrode 210 and the second upper side electrode 220.

The substrate 105 may include, for example, a silicon substrate. A drive circuit may be provided on the silicon substrate to drive the nonvolatile memory device.

The memory unit 300 may include, for example, $NiO_x$, $TiO_x$, $CoO_x$, $TaO_x$, $MnO_x$, $WO_x$, $Al_2O_3$, $FeO_x$, $HfO_x$, $ZnMn_2O_4$, $ZnFe_2O_4$, $ZnCo_2O_4$, $ZnCr_2O_4$, $ZnAl_2O_4$, $CuCoO_2$, $CuAlO_2$, $NiWO_4$, $NiTiO_3$, $CoAl_2O_4$, $MnAl_2O_4$, $ZnNiTiO_4$, $Pr_xCa_{1-x}MnO_3$, SiC and the like.

The memory unit 300 also may include a dopant added to the various metal oxides recited above.

However, the invention is not limited thereto. The memory unit 300 may include any material having a resistance changeable by performing at least one selected from applying an electric field and providing a current. The memory unit 300 also may include a so-called phase change material which has a resistance changeable according to the change of a phase state caused by at least one selected from applying an electric field and providing a current. Thus, a material having a resistance changeable according to a phase change also is taken to be a resistance change material.

The lower side electrode 130 (the first lower side electrode 110 and the second lower side electrode 120) and the upper side electrode 230 (the first upper side electrode 210 and the second upper side electrode 220) may include, for example, tungsten, tungsten silicide, tungsten nitride, and the like.

The insulating spacer layer 150 may include, for example, silicon oxide, silicon nitride, and the like having a high electrical resistance.

The lower side electrode 130 may be taken to be a bit line (BL); and the upper side electrode 230 may be taken to be a word line (WL). However, the lower side electrode 130 may be taken to be the word line (WL); and the upper side electrode 230 may be taken to be the bit line (BL).

In the nonvolatile memory device 10, the voltage applied to each of the memory units 300 can be changed by combining the potential applied to the lower side electrode 130 and the potential applied to the upper side electrode 230 to store information by the characteristics of the memory unit 300 at that time. A rectifying element unit 320 having a rectifying characteristic, for example, may be provided to provide a directionality to the polarity of the voltage applied to the memory unit 300 at that time. The rectifying element unit 320 may include an element having a rectifying characteristic such as, for example, a PIN diode, MIM (Metal-Insulator-Metal) element, etc.

Although an example is illustrated in FIGS. 1A to 2B in which the rectifying element unit 320 is provided between the lower side electrode 130 and the memory unit 300, the rectifying element unit 320 may be provided between the upper side electrode 230 and the memory unit 300. Also, the rectifying element unit 320 may be provided in a region other than the region where the lower side electrode 130 opposes the upper side electrode 230.

In the nonvolatile memory device 10, not-illustrated barrier metal layers may be provided between the lower side electrode 130 and the rectifying element unit 320, between the rectifying element unit 320 and the memory unit 300, and between the memory unit 300 and the upper side electrode 230. Titanium (Ti), titanium nitride (TiN), and the like may be used as the barrier metal layers.

The memory unit 300 and the rectifying element unit 320 provided between the lower side electrode 130 and the upper side electrode 230 are patterned into each region where the electrodes intersect three dimensionally. An inter-element isolation insulating film 180 is provided around the memory unit 300. The memory unit 300 and the rectifying element unit 320 may have a configuration having a rectangular parallelepiped cross section when cut in the XY plane, a configuration having, for example, a cross section of a polygon having five or more sides, a circular columnar configuration, for example, having a circular cross section, etc.

In the nonvolatile memory device 10 according to this embodiment, as described below, the second lower side electrode 120 is formed by forming the insulating spacer layer 150 on the side walls of the first lower side electrodes 110 and burying a conducting film between the insulating spacer layers 150.

Thereby, the disposition pitch of the lower side electrode 130 including the first lower side electrode 110 and the second lower side electrode 120 can be a minimum pattern line width F.

Similarly, the second upper side electrode 220 is formed by forming the insulating spacer layer 250 on the side walls of the first upper side electrodes 210 and burying a conducting film between the insulating spacer layers 250.

Thereby, the disposition pitch of the upper side electrode 230 including the first upper side electrode 210 and the second upper side electrode 220 can be the minimum pattern line width F.

Thereby, in the nonvolatile memory device 10 according to this embodiment, the practical element surface area of one memory cell can be substantially $F^2$; and a nonvolatile memory device can be provided having a bit density higher than $4F^2$.

Although the insulating spacer layer recited above is applied to both the lower side electrode 130 and the upper side electrode 230 to set the width of each of the lower side electrode 130 and the upper side electrode 230 to be a value near F in this specific example, the invention is not limited thereto. The insulating spacer layer recited above may be applied to at least one selected from the lower side electrode 130 and the upper side electrode 230. In the case where the insulating spacer layer recited above is applied to one selected from the lower side electrode 130 and the upper side electrode 230, the element surface area of one memory cell is substantially $2F^2$. In such a case as well, a nonvolatile memory device can be provided having a bit density higher than $4F^2$.

Hereinbelow, the case is described where the insulating spacer layer recited above is applied to both the lower side electrode 130 and the upper side electrode 230. Because the first upper side electrode 210 and the second upper side electrode 220 of the upper side electrode 230 may have configurations similar to those of the first lower side electrode 110 and the second lower side electrode 120 of the lower side electrode 130, respectively, mainly the first lower side electrode 110 and the second lower side electrode 120 of the lower side electrode 130 are described hereinbelow.

A line width L2 of the second lower side electrode 120 is P–L1–2t, where L1 is the line width of the first lower side electrode 110, P is the disposition pitch of the first lower side electrode 110, and t is the thickness of the insulating spacer layer. In other words, the line width L2 of the second lower side electrode 120 is narrower than the spacing (P–L1) between the first lower side electrodes 110 by twice the thickness of the insulating spacer layer 150. In the case where the line width of the first lower side electrode 110 is reduced from the minimum pattern line width F of the lithography to F–t by a slimming process in consideration thereof, the line width L2 of the second lower side electrode 120 becomes P–F–t. Here, because the disposition pitch P of the first lower side electrode 110 is substantially 2F, the line width L2 of the second lower side electrode 120 is F–t; and the line width of the first lower side electrode 110 can be made equal to the line width of the second lower side electrode 120.

Similarly, the line width of the first upper side electrode 210 can be made equal to the line width of the second upper side electrode 220.

In the case where the line width L1 of the first lower side electrode 110 is different from the line width L2 of the second lower side electrode 120, the voltages (at least one voltage selected from the set voltage and the reset voltage) applied to the first lower side electrode 110 and the second lower side electrode 120 by controlling the peripheral circuit can be changed to compensate by changing the driving conditions of the first lower side electrode 110 and the second lower side electrode 120.

Similarly, in the case where the line width of the first upper side electrode 210 is different from the line width of the second upper side electrode 220, the voltage applied to the first upper side electrode 210 may be set to be different from the voltage applied to the second upper side electrode 220. For example, at least one selected from the absolute value of the voltage applied to the first upper side electrode 210 being different from the absolute value of the voltage applied to the second upper side electrode 220 and the duration of the voltage pulse applied to the first upper side electrode 210 being different from the duration of the voltage pulse applied to the second upper side electrode 220 is true. That is, a width of the first electrode is different from a width of the second electrode, and the first electrode is provided with a first voltage and the second electrode is provided with a second voltage. The second voltage may have at least one selected from an absolute value different from an absolute value of the first voltage and a duration of a voltage pulse different from a duration of a voltage pulse of the first voltage.

Thereby, in the nonvolatile memory device 10 according to this embodiment, a compensation can be performed and stable characteristics can be obtained even in the case where the line width L1 of the first lower side electrode 110 is different from the line width L2 of the second lower side electrode 120 and the case where the line width of the first upper side electrode 210 is different from the line width of the second upper side electrode 220.

The nonvolatile memory device 10 illustrated in FIGS. 1A and 1B is an example in which the width of the insulating spacer layer 150 is narrower than the width of the first lower side electrode 110 and the width the second lower side electrode 120. Thereby, the widths of the first lower side electrode 110 and the second lower side electrode 120 can be wide to reduce the interconnect resistance of the lower side electrode 130. Similarly, the width of the insulating spacer layer 250 is narrower than the width of the first upper side electrode 210 and the width of the second upper side electrode 220. Thereby, the widths of the first upper side electrode 210 and the second upper side electrode 220 can be wide to reduce the interconnect resistance of the upper side electrode 230.

The side walls of the first lower side electrode 110 and the second lower side electrode 120, as described below, have inclined tapered configurations due to the manufacturing.

Namely, the cross-sectional configuration of the first lower side electrode 110 is a trapezoid in which the upper side is shorter than the lower side. The cross-sectional configuration of the second lower side electrode 120 is a trapezoid in which the upper side is longer than the lower side.

In other words, the first lower side electrode 110 has forward-tapered side walls. The second lower side electrode 120 has reverse-tapered side walls and is adjacent to the first lower side electrode 110 via the insulating spacer layer 150 in substantially the same plane.

In the description recited above, the second lower side electrode 120 may have a forward taper; and the first lower side electrode 110 may have a reverse taper and be adjacent to the second lower side electrode 120 via the insulating spacer layer 150 in substantially the same plane.

Thereby, the first lower side electrode 110 and the second lower side electrode 120 may have cross-sectional configurations having a forward taper and a reverse taper, respectively; and the contact surface area between the first lower side electrode 110 and the insulating spacer layer 150 and between the second lower side electrode 120 and the insulating spacer layer 150 can be greater than the case where the cross-sectional configurations of the first lower side electrode 110 and the second lower side electrode 120 are perpendicular.

Thereby, even in the case where the line widths of the first and second lower side electrodes 110 and 120 are fine and the adhesion with the major surface 106 of the substrate 105 decreases, the first and second lower side electrodes 110 and 120 are in contact horizontally via the insulating spacer layer 150 in substantially the same plane; and the adhesion strength in the plane parallel to the major surface 106 of the substrate 105 is increased. Thereby, even in the case where the line widths of the first and second lower side electrodes 110 and 120 are fine, the first and second lower side electrodes 110 and 120 can be adhered closely and securely to the substrate 105;

these electrodes can be closely and stably adhered to the substrate during manufacturing processes of the nonvolatile memory device 10 during and after forming these electrodes; and further, the reliability and durability after product completion is improved.

Similarly to the lower side electrode 130, the upper side electrode 230 of the nonvolatile memory device 10 includes the first upper side electrode 210 (the first electrode) having forward-tapered side walls and the second upper side electrode 220 (the second electrode) having reverse-tapered side walls and being adjacent to the first upper side electrode 210 via the insulating spacer layer 250 in substantially the same plane. Thereby, the first and second upper side electrodes 210 and 220 can be adhered closely and securely to the memory unit 300 (or the rectifying element unit 320) and closely and stably adhered to each other during the manufacturing processes of the nonvolatile memory device 10; and further, the reliability and the durability after product completion are improved.

Although a configuration in which the first and second electrodes have a forward taper and a reverse taper is applied to both the lower side electrode 130 and the upper side electrode 230 in this specific example, the invention is not limited thereto. The configuration in which the first and second electrodes have the forward taper and the reverse taper recited above may be applied to either the lower side electrode 130 or the upper side electrode 230.

An example of a method for manufacturing the nonvolatile memory device 10 will now be described.

Figure 3:
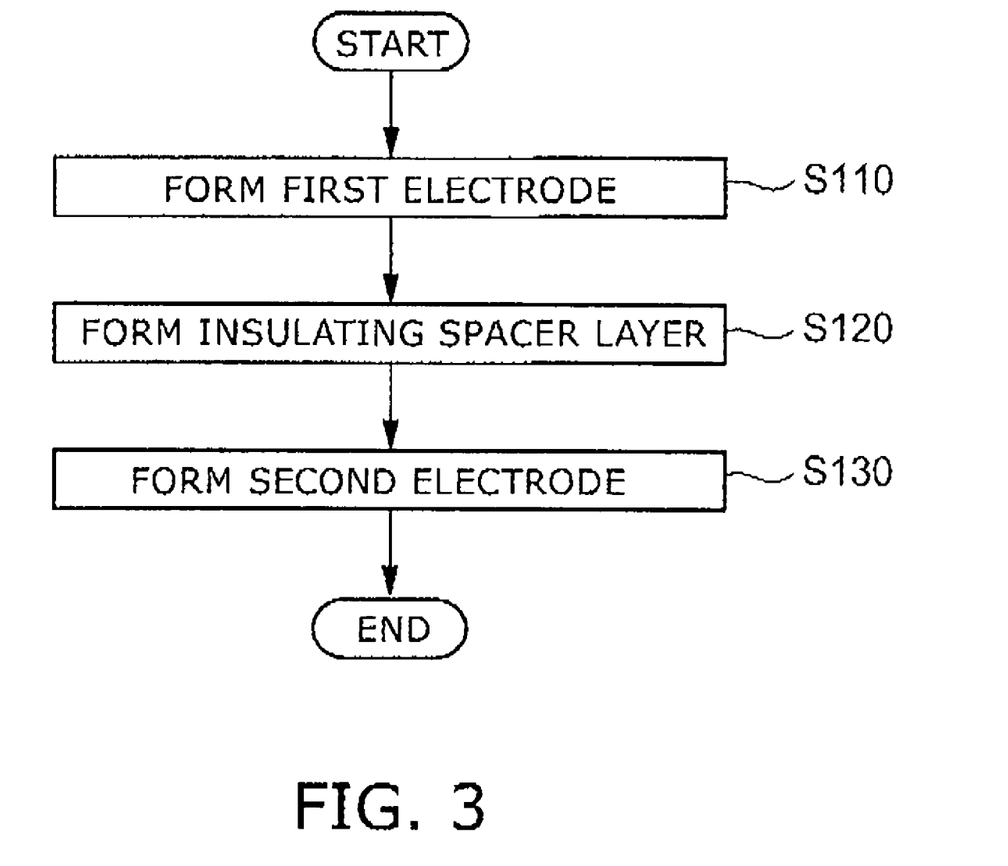
FIG. 3 is a flowchart illustrating the method for manufacturing the nonvolatile memory device according to the first embodiment of the invention.

FIG. 3 is a flowchart illustrating the method for manufacturing the nonvolatile memory device according to the first embodiment of the invention.

In the method for manufacturing the nonvolatile memory device according to this embodiment, first, multiple first electrodes (the first lower side electrodes 110) having band configurations disposed in parallel are formed as illustrated in FIG. 3 (step S110).

Then, the insulating spacer layer 150 is formed on the side faces of the multiple first electrodes (the first lower side electrodes 110) (step S120).

Continuing, a conductor is filled between adjacent insulating spacer layers 150 to form the second electrodes (the second lower side electrodes 120) (step S130). In other words, the second electrodes (the second lower side electrodes 120) are formed self-aligned with respect to the first electrodes (the first lower side electrodes 110).

Thus, the second lower side electrodes 120 are formed self-aligned by a damascene process between the first lower side electrodes 110, that is, between the insulating spacer layers 150. Thereby, the first and second lower side electrodes 110 and 120 can be formed with a density substantially twice the density corresponding to the minimum pattern line width of the lithography.

Specifics will now be described.

FIGS. 4A to 4E are schematic cross-sectional views in order of the processes, illustrating the method for manufacturing the nonvolatile memory device according to the first embodiment of the invention.

Figure 4A:
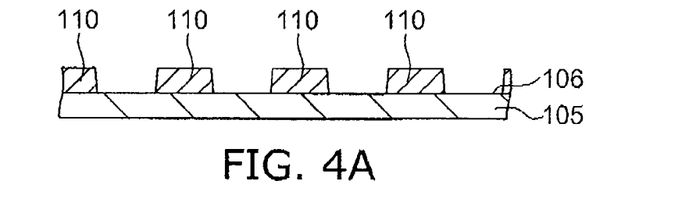
FIGS. 4A to 4E are schematic cross-sectional views in order of the processes, illustrating the method for manufacturing the nonvolatile memory device according to the first embodiment of the invention.

First, as illustrated in FIG. 4A, the first lower side electrode 110 is formed by lithography and dry etching after forming a conducting film on the major surface 106 of the substrate 105. In such a case, the line width of the first lower side electrode 110 may be the minimum patternable line width of the lithography.

Sputtering, for example, may be used to form the conducting film. However, the forming is not limited thereto; and any method may be used.

Generally, the side walls of the first lower side electrode 110 have a tapered configuration.

In the case where the conducting film recited above has a thin film thickness (height) and in the case where the width of the first lower side electrode 110 is wide, that is, in the case where the aspect ratio of the cross section when the first lower side electrode 110 is cut in the YZ plane is low, the side walls of the first lower side electrode 110 are nearly perpendicular to the major surface. However, the film thickness (height) of the conducting film is made to be thick to increase the memory density of the nonvolatile memory device and suppress the increase of the interconnect resistance; and further, the width of the first lower side electrode 110 is made to be narrow considering the patterning precision. In other words, the aspect ratio of the cross section of the first lower side electrode 110 may be high. In such a case, it is difficult to perform perpendicular patterning by dry etching; the side walls of the first lower side electrode 110 are inclined with respect to the major surface 106; and the side walls have a tapered configuration.

Figure 4B:
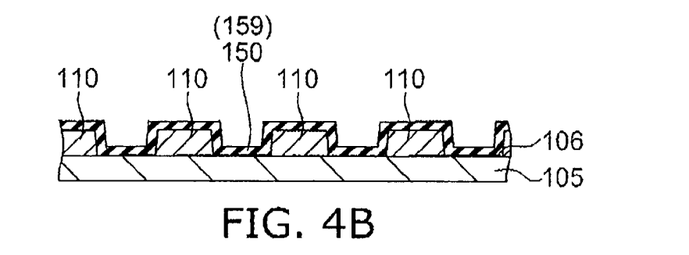

Then, as illustrated in FIG. 4B, a silicon nitride film 159 forming the insulating spacer layer 150 is formed on the first lower side electrode 110 and the major surface 106 of the substrate 105 by, for example, low pressure CVD (Chemical Vapor Etching). The invention is not limited to the description recited above. In addition to the silicon nitride film 159, a silicon oxide film and the like may be used as the film forming the insulating spacer layer 150; and a method other than low pressure CVD may be used as the film formation method.

Figure 4C:
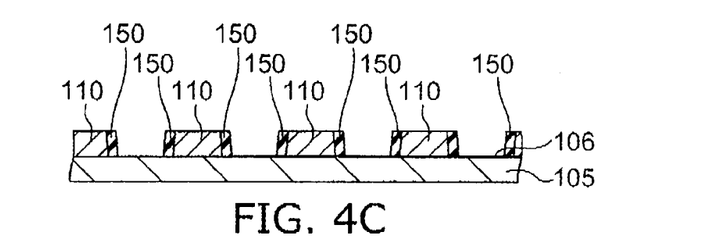

Continuing as illustrated in FIG. 4C, the silicon nitride film 159 on the first lower side electrodes 110 and on the major surface 106 of the substrate 105 between the first lower side electrodes 110 is removed by, for example, dry etching. Thereby, the insulating spacer layers 150 are formed on the side faces of the first lower side electrodes 110. At this time, the side walls of the insulating spacer layers 150 have a tapered configuration following the side walls of the first lower side electrode 110.

Figure 4D:
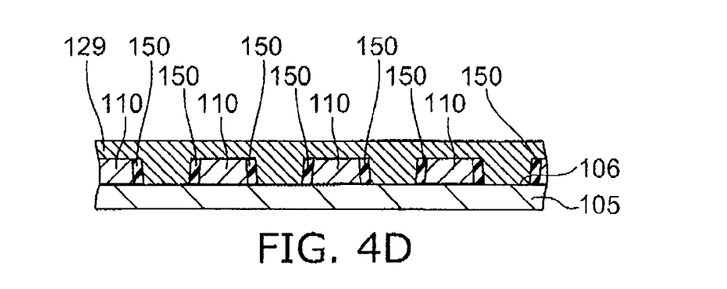

Then, as illustrated in FIG. 4D, a conducting film 129 forming the second lower side electrode 120 is formed by, for example, CVD. At this time, the side walls of the insulating spacer layers 150 have a tapered configuration. Therefore, the fillability of the conducting film 129 into the space between the insulating spacer layers 150 is good.

Figure 4E:
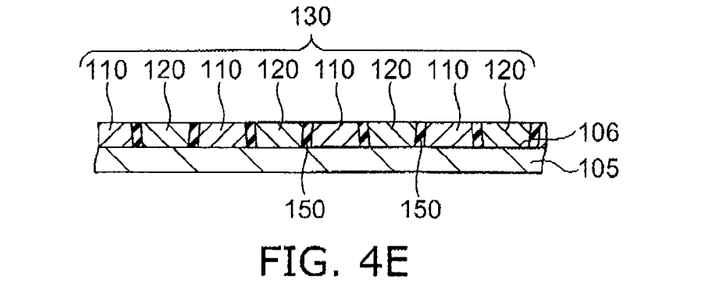

Continuing as illustrated in FIG. 4E, the conducting film 129 is polished and planarized by, for example, CMP (Chemical Mechanical Polishing); and the second lower side electrode 120 is obtained self-aligned with respect to the first lower side electrode 110.

Thereby, the first lower side electrode 110 having forward-tapered side walls can be formed; and the second lower side electrode 120 having reverse-tapered side walls and being adjacent to the first lower side electrode 110 via the insulating spacer layer 150 in substantially the same plane can be formed.

In the process described in regard to FIG. 4A, it is possible to provide the first lower side electrode 110 with forward-tapered side walls by, for example, controlling the resist exposure conditions and the etching conditions. Thereby, an even greater angle of the tapered configuration of the side walls of the insulating spacer layers 150 can be formed.

Subsequently, the rectifying element unit 320 and the memory unit 300 are formed. Then, the first upper side electrode 210 and the second upper side electrode 220 of the upper side electrode 230 are formed.

Thereby, the nonvolatile memory device 10 illustrated in FIGS. 1A to 2B can be formed.

Thus, the second lower side electrode 120 and the second upper side electrode 220 are formed self-aligned by a damascene process that buries between the first lower side electrodes 110 via the insulating spacer layers 150 and between the first upper side electrode 210 via the insulating spacer layers 250 to form the lower side electrode 130 and the upper side electrode 230 with a density substantially four times the density corresponding to the minimum pattern line width of the lithography. Thereby, the element surface area of one memory cell of the nonvolatile memory device 10 is substantially $F^2$; and a nonvolatile memory device can be provided with a bit density higher than $4F^2$.

The first and second lower side electrodes 110 and 120 are in contact via the insulating spacer layer 150 in substantially the same plane and can be adhered closely and securely to the substrate 105; and the reliability and durability also are improved. Also, the first and second upper side electrodes 210 and 220 are in contact via the insulating spacer layer 250 in substantially the same plane and can closely and securely adhere to the memory unit 300 or the rectifying element unit 320; and the reliability and durability also are improved.

As described above, in the case where the first lower side electrode 110 is formed with the minimum patternable line width F by lithography, the line width of the second lower side electrode 120 formed by a damascene process by filling is different from the line width of the first lower side electrode 110 by twice the layer thickness of the insulating spacer layer 150. Conversely, the line widths of the first lower side electrode 110 and the second lower side electrode 120 can be made equal by making the first lower side electrode 110 finer than F by performing a slimming process that controls, for example, the exposure amount when exposing the resist mask and the etching conditions during the lithography and the dry etching when forming the first lower side electrode 110 illustrated in FIG. 4A.

Although the patterning by etching recited above is performed by using the resist mask as a mask, patterning may be performed using a hard mask or a multilayered resist mask. In other words, particularly in the case where the width (pitch) of the interconnect is small, etc., a hard mask or multilayered resist mask of, for example, $SiO_2$ and the like may be used. In such a case, the line widths of the first lower side electrode 110 and the second lower side electrode 120 can be made equal to each other by implementing slimming when patterning with the hard mask or the multilayered resist mask.

Similarly, the first upper side electrode 210 may be made finer than F by a slimming process. Thereby, the line widths of the first upper side electrode 210 and the second upper side electrode 220 can be made equal to each other.

In the description recited above, the memory unit 300 (and the rectifying element unit 320) provided between the lower side electrode 130 and the upper side electrode 230 is patterned into each of the regions where the electrodes intersect three dimensionally. It is desirable for the lithography used when forming the memory unit 300 (and the rectifying element unit 320) to have a higher precision than that of the lithography used when forming the lower side electrode 130 and the upper side electrode 230 for which an insulating spacer layer such as that recited above is applied.

In other words, when the lower side electrode 130 and the upper side electrode 230 are formed using the manufacturing method illustrated in FIGS. 4A to 4E, the lower side electrode 130 and the upper side electrode 230 are formed with a pitch of the minimum pattern line width F of the lithography used in such processes. In such a case, it is necessary for the memory unit 300 to be patterned to a width not more than the equivalent of the line widths of the lower side electrode 130 and the upper side electrode 230, that is, not more than about the minimum line width F. In other words, it is desirable for the lithography used when forming the memory unit 300 to be able to realize a line width finer than the line width realized by the lithography used when forming the lower side electrode 130 and the upper side electrode 230.

For example, in the case where dry lithography having a minimum line width of about 70 nm is used to pattern the lower side electrode 130 and the upper side electrode 230, immersion lithography having a minimum line width of about 40 nm, EUV (Extreme Ultra-Violet) lithography having a minimum line width of about 20 nm, and nanoimprinting having a minimum line width of about 5 nm, for example, may be used to pattern the memory unit 300.

Also, for example, in the case where immersion lithography having a minimum line width of about 40 nm is used to pattern the lower side electrode 130 and the upper side electrode 230, EUV lithography having a minimum line width of about 20 nm and nanoimprinting having a minimum line width of about 5 nm, for example, may be used to pattern the memory unit 300.

Further, for example, in the case where EUV lithography having a minimum line width of not more than about 20 nm is used to pattern the lower side electrode 130 and the upper side electrode 230, nanoimprinting having a minimum line width of about 5 nm, for example, may be used to pattern the memory unit 300.

In other words, in the nonvolatile memory device 10 and the method for manufacturing the same according to this embodiment, the lower side electrode 130 and the upper side electrode 230 having the target line widths can be realized while using lithography having a minimum line width greater than that of the lithography used to form the memory unit 300.

The manufacturing cost would be extremely high in the case where the photolithography corresponding to the line width necessary for each of the memory unit 300, the lower side electrode 130, and the upper side electrode 230 is used. Conversely, in this embodiment, the line width requirement of the photolithography forming the lower side electrode 130 and the upper side electrode 230 can be relaxed; and a nonvolatile memory device having the target line width can be realized with lower costs.

Figure 5:
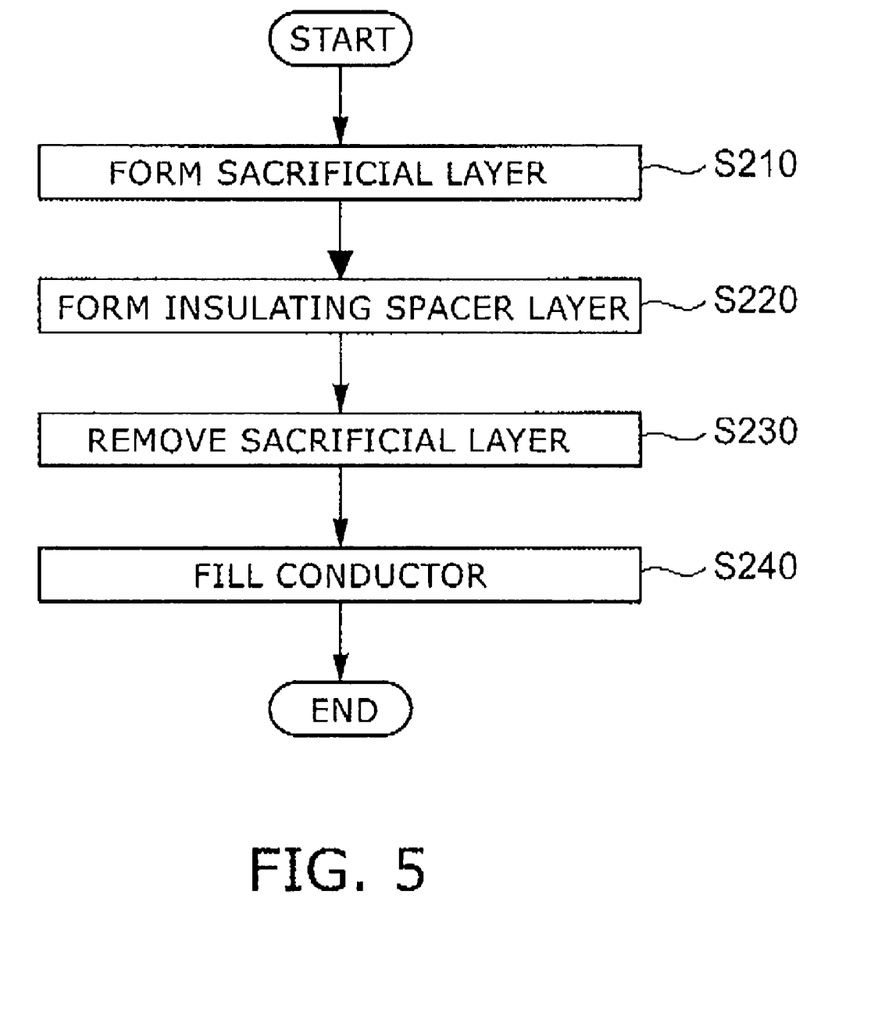
FIG. 5 is a flowchart illustrating another method for manufacturing the nonvolatile memory device according to the first embodiment of the invention.

FIG. 5 is a flowchart illustrating another method for manufacturing the nonvolatile memory device according to the first embodiment of the invention.

In the method for manufacturing the nonvolatile memory device according to this embodiment, first, multiple sacrificial layers having band configurations disposed in parallel are formed as illustrated in FIG. 5 (step S210).

Then, the insulating spacer layer 150 is formed on the side faces of the multiple sacrificial layers (step S220). Then, the multiple sacrificial layers are removed (step S230).

Continuing, a conductor is filled between adjacent insulating spacer layers (step S240). Thereby, for example, the first lower side electrode 110 and the second lower side electrode 120 can be formed self-aligned with respect to the insulating spacer layers.

In such a case as well, the sacrificial layer is formed with the minimum pattern line width of the lithography; and the first and second lower side electrodes 110 and 120 can be formed with a density substantially twice the density corresponding to the minimum pattern line width of the lithography.

Specifics will now be described.

FIGS. 6A to 6E are schematic cross-sectional views in order of the processes, illustrating another method for manufacturing the nonvolatile memory device according to the first embodiment of the invention.

Figure 6A:
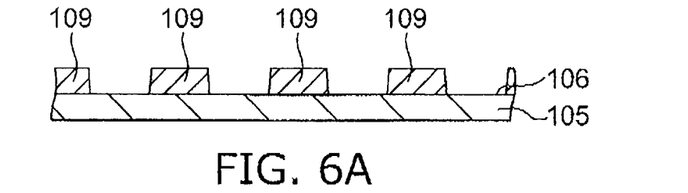
FIGS. 6A to 6E are schematic cross-sectional views in order of the processes, illustrating another method for manufacturing the nonvolatile memory device according to the first embodiment of the invention.

First, as illustrated in FIG. 6A, a sacrificial layer 109 is formed on the major surface 106 of the substrate 105 by film formation, lithography, and dry etching. At this time, the line width of the sacrificial layer 109 may be the minimum patternable line width of the lithography. The sacrificial layer 109 may include any material having a high selectivity with respect to the insulating spacer layer 150 described below.

Figure 6B:
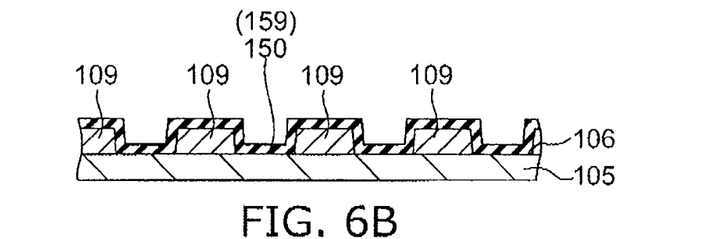

Then, as illustrated in FIG. 6B, the silicon nitride film 159 forming the insulating spacer layer 150 is formed on the sacrificial layer 109 and the major surface 106 of the substrate 105 by, for example, low pressure CVD.

Figure 6C:
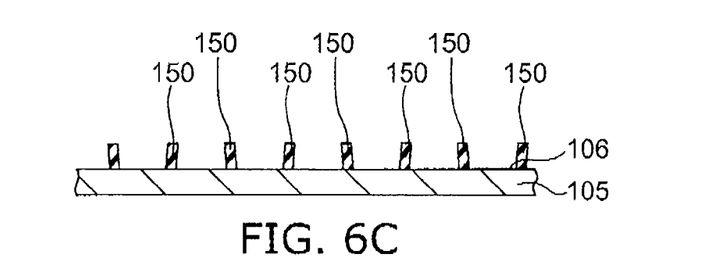

Continuing as illustrated in FIG. 6C, the sacrificial layer 109 is removed. Any dry etching method and any wet etching method may be used for the removal.

Figure 6D:
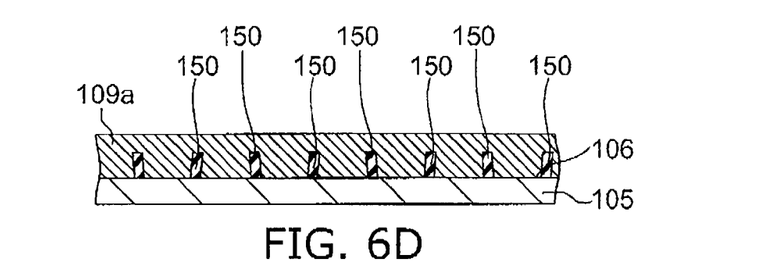

Then, as illustrated in FIG. 6D, a conducting film is formed on the insulating spacer layers 150 and the substrate 105 by, for example, CVD to fill a conductor 109a between adjacent insulating spacer layers 150.

Figure 6E:
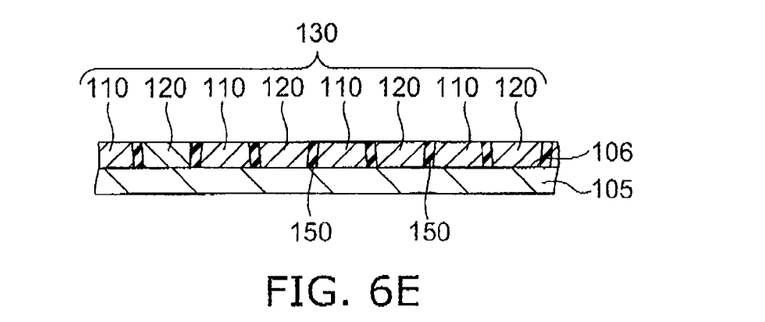

Continuing as illustrated in FIG. 6E, the conducting film is polished and planarized by, for example, chemical mechanical polishing. Thereby, the first lower side electrode 110 and the second lower side electrode 120 can be formed self-aligned with respect to the insulating spacer layers 150.

Then, the rectifying element unit 320 and the memory unit 300 are subsequently formed. The first upper side electrode 210 and the second upper side electrode 220 of the upper side electrode 230 are similarly formed.

Thereby, another nonvolatile memory device according to this embodiment can be formed.

In this method as well, the side walls of the sacrificial layer 109 have small taper angles (nearly perpendicular) but can be provided with a forward taper. Thereby, the first electrode and the second electrode can have, for example, side walls having small forward taper angles and side walls having small reverse taper angles, respectively.

In other words, in another nonvolatile memory device according to this embodiment, at least one selected from the lower side electrode 130 and the upper side electrode 230 may include the first electrode having forward-tapered side walls and the second electrode having reverse-tapered side walls and being adjacent to the first electrode via the insulating spacer layer 250 in substantially the same plane.

Second Embodiment

Figure 7A:
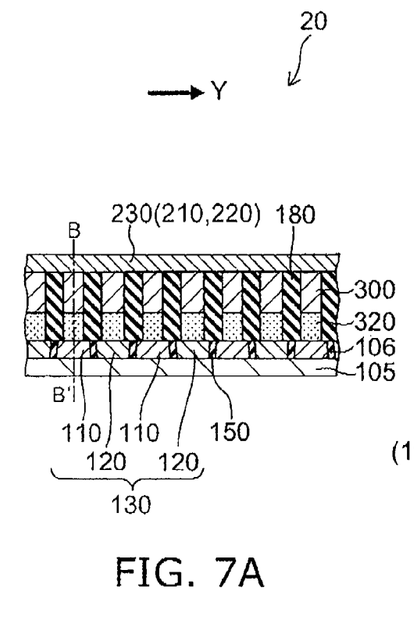
FIGS. 7A and 7B are schematic cross-sectional views illustrating the configuration of a nonvolatile memory device according to a second embodiment of the invention.
Figure 7B:
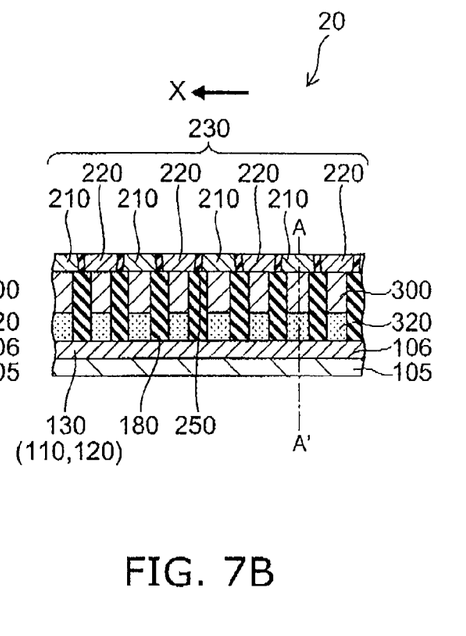

FIGS. 7A and 7B are schematic cross-sectional views illustrating the configuration of a nonvolatile memory device according to a second embodiment of the invention.

In a nonvolatile memory device 20 according to the second embodiment, the width of the memory unit 300 is narrower than the widths of the first electrode and the second electrode as illustrated in FIGS. 7A and 7B.

In other words, the width of the memory unit 300 in the Y axis direction is, for example, narrower than the width of the first lower side electrode 110 in the Y axis direction and narrower than the width of the second lower side electrode 120 in the Y axis direction. Thereby, ample margin of, for example, the matching precision of the photolithography is provided when forming the memory unit 300 on the lower side electrode 130; and manufacturing is easier.

The width of the memory unit 300 in the X axis direction may be, for example, narrower than the width of the upper side electrode 210 in the X axis direction and narrower than the width of the second upper side electrode 220 in the X axis direction. Thereby, the matching precision between the memory unit 300 and the lower side electrode 130 can be relaxed.

Figure 8A:
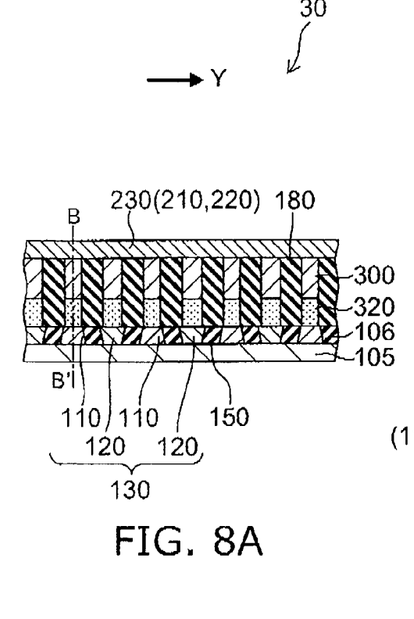
FIGS. 8A and 8B are schematic cross-sectional views illustrating the configuration of another nonvolatile memory device according to the second embodiment of the invention.
Figure 8B:
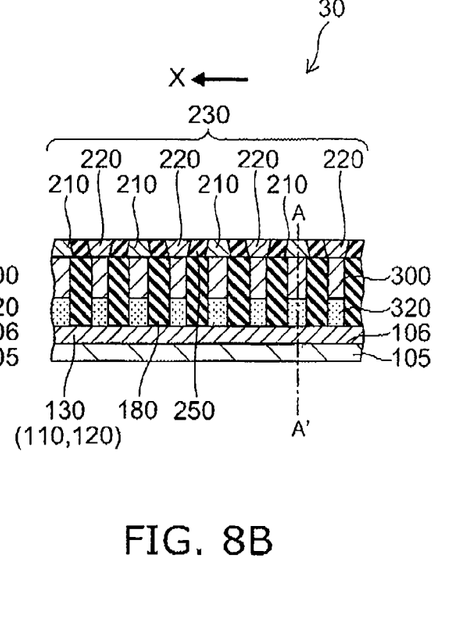

FIGS. 8A and 8B are schematic cross-sectional views illustrating another configuration of the nonvolatile memory device according to the second embodiment of the invention.

In a nonvolatile memory device 30 according to the second embodiment, the width of the insulating spacer layer 150 of the lower side electrode 130 is substantially the same as the widths of the first lower side electrode 110 and the second lower side electrode 120 as illustrated in FIGS. 8A and 8B. Also, the width of the insulating spacer layer 250 of the upper side electrode 230 is substantially the same as the widths of the first upper side electrode and the second upper side electrode 220. In such a case as well, the disposition pitch of each of the lower side electrode 130 and the upper side electrode 230 may be the minimum pattern line width F. Thereby, the matching precision between the lower side electrode 130 and the memory unit 300 and the matching precision between the memory unit 300 and the upper side electrode 230 can be relaxed; and manufacturing is easier.

Further, in the nonvolatile memory device 30 in which the width of the insulating spacer layer 150 (250) is substantially the same as the widths of the first electrode and the second electrode as illustrated in FIGS. 8A and 8B, the width of the memory unit 300 may be narrower than the widths of the first electrode (the first lower side electrode 110 and the first upper side electrode 210) and the second electrode (the second lower side electrode 120 and the second upper side electrode 220). Thereby, the matching precision can be relaxed further; and manufacturing is easier.

Hereinabove, exemplary embodiments of the invention are described with reference to specific examples. However, the invention is not limited to these specific examples. For example, one skilled in the art may appropriately select specific configurations of components of nonvolatile memory devices and methods for manufacturing nonvolatile memory devices from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile memory devices and methods for manufacturing nonvolatile memory devices practicable by an appropriate design modification by one skilled in the art based on the nonvolatile memory devices and the methods for manufacturing nonvolatile memory devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

The invention claimed is:

1. A nonvolatile memory device, comprising:
a lower side electrode aligned in a first direction;
an upper side electrode positioned above the lower side electrode and aligned in a second direction intersecting the first direction; and
a memory unit provided between the lower side electrode and the upper side electrode,
at least one selected from the lower side electrode and the upper side electrode including a first electrode and a second electrode, the first electrode having a forward-tapered side wall, the second electrode having a reverse-tapered side wall and being adjacent to the first electrode via an insulating layer in substantially identical plane.

2. The device according to claim 1, wherein a width of the memory unit is narrower than a width of the first electrode and a width of the second electrode.

3. The device according to claim 1, wherein a width of the first electrode is different from a width of the second electrode and a voltage applied to the first electrode is different from a voltage applied to the second electrode.

4. The device according to claim 1, wherein
a width of the first electrode is different from a width of the second electrode, and
the first electrode is provided with a first voltage and the second electrode is provided with a second voltage, the second voltage has at least one selected from an absolute value different from an absolute value of the first voltage and a duration of a voltage pulse different from a duration of a voltage pulse of the first voltage.

5. The device according to claim 1, wherein the memory unit includes at least one selected from the group consisting of $NiO_x$, $TiO_x$, $CoO_x$, $TaO_x$, $MnO_x$, $WO_x$, $Al_2O_3$, $FeO_x$, $HfO_x$, $ZnMn_2O_4$, $ZnFe_2O_4$, $ZnCo_2O_4$, $ZnCr_2O_4$, $ZnAl_2O_4$, $CuCoO_2$, $CuAlO_2$, $NiWO_4$, $NiTiO_3$, $CoAl_2O_4$, $MnAl_2O_4$, $ZnNiTiO_4$, $Pr_xCa_{1-x}MnO_3$ and SiC.

6. The device according to claim 1, wherein at least one selected from the first electrode and the second electrode includes at least one selected from the group consisting of tungsten, tungsten silicide, and tungsten nitride.

7. The device according to claim 1, wherein the insulating layer includes at least one selected from silicon oxide and silicon nitride.

8. The device according to claim 1, wherein a disposition pitch of the at least one selected from the lower side electrode and the upper side electrode including the first electrode and the second electrode is substantially a minimum pattern line width.

* * * * *